United States Patent [19]

Norose

[11] Patent Number: 5,285,177

[45] Date of Patent: Feb. 8, 1994

[54] ANTENNA SHARING DEVICE USING MUTUALLY COUPLED RESONANT CIRCUITS

[75] Inventor: Masahiro Norose, Tsurugashima, Japan

[73] Assignee: Toko Kabushiki Kaisha, Tokyo, Japan

[21] Appl. No.: 944,271

[22] Filed: Sep. 14, 1992

[30] Foreign Application Priority Data

Sep. 13, 1991 [JP] Japan .................................. 3-262986
Feb. 24, 1992 [JP] Japan .................................. 4-72891

[51] Int. Cl.$^5$ .............................................. H03H 7/00
[52] U.S. Cl. .................................... 333/176; 333/132; 333/129; 333/175; 455/41; 455/82; 455/83
[58] Field of Search ............... 333/132, 172, 176, 177, 333/129; 455/41, 82, 83, 79, 114

[56] References Cited

U.S. PATENT DOCUMENTS 4,980,660 12/1990 Nakamura ........................... 333/101

Primary Examiner—Robert J. Pascal
Assistant Examiner—Darius Gambino
Attorney, Agent, or Firm—Cushman, Darby & Cushman

[57] ABSTRACT

An antenna sharing device having a transmission filter connectable between a branch node of an antenna and a transmitter and a reception filter connectable between the branch node and a receiver. At least one of the transmission filter and the reception filter includes: a first parallel resonance circuit having a capacitor and a coil connected in parallel; a second parallel resonance circuit magnetically coupled to the first parallel resonance circuit; and a capacitor serially connected to the first parallel resonance circuit. One of the first and second parallel resonance circuits has a first resonance frequency, the other of the first and second parallel resonance circuits has one of the first resonance frequency and a second resonance frequency, and a combination of the first and second parallel resonance circuits and the capacitor forms an equivalent circuit providing a small insertion impedance at a third resonance frequency.

12 Claims, 7 Drawing Sheets

ANTENNA SHARING DEVICE USING MUTUALLY COUPLED RESONANT CIRCUITS

BACKGROUND OF THE INVENTION

1. Field of the Invention

The present invention relates to the structure of a transmission filter and reception filter of an antenna sharing device.

2. Description of the Related Art

Mobile radio apparatuses, such as cordless main and sub-telephones and mobile telephones, communicate bi-directionally using a single antenna shared for transmission and reception.

Such an antenna uses an antenna sharing device for separating transmission and reception signals so as to prevent them from being mixed with each other at a transmitter or receiver.

FIG. 13 is a block diagram of an antenna sharing device. An antenna 1 is coupled at an antenna branch node 2 to a transmission filter 5 and to a reception filter 6. The transmission filter 5 is connected to a transmitter (not shown) at a terminal 3, and the reception filter 6 is connected to a receiver (not shown) at a terminal 4. Transmission and reception signals are separated by the filters 5 and 6.

FIG. 14 is a circuit diagram showing part of a transmission filter of a conventional antenna sharing device. This transmission filter is constructed of a band-pass filter and a parallel resonance circuit 11. The parallel resonance circuit 11 is connected between an antenna branch node 2 and the output terminal of the band-pass filter which is constructed of a plurality of parallel resonance circuits 10 and coupling capacitors C9. The input terminal of the band-pass filter being connected to a transmitter. The band-pass filter passes only transmission signals and intercepts unnecessary signals, and the parallel resonance circuit 11 prevents reception signals from entering the transmitter.

Such a transmission filter requires a number of coils of the parallel resonance circuits 10 and 11. Moreover, each parallel resonance circuit is required to be shielded within a case, making its size large and resulting in a large size antenna sharing device.

SUMMARY OF THE INVENTION

It is an object of the present invention to provide an antenna sharing device having transmission and reception filters of a simple structure and small size.

According to an aspect of the present invention, there is provided an antenna sharing device having a transmission filter connectable between a branch node of an antenna and a transmitter, and a reception filter connectable between the branch node and a receiver, wherein at least one of the transmission filter and the reception filter comprises:

a first parallel resonance circuit having a capacitor and a coil connected in parallel;

a second parallel resonance circuit magnetically coupled to the first parallel resonance circuit; and a capacitor serially connected to the first parallel resonance circuit, wherein one of the first and second parallel resonance circuits has a first resonance frequency, the other of the first and second parallel resonance circuits has one of the first resonance frequency and a second resonance frequency, and a combination of the first and second parallel resonance circuits and the capacitor forms an equivalent circuit providing a small insertion impedance at a third resonance frequency.

The signals having the first and second resonance frequencies are intercepted by the filters, and the signals having the third resonance frequency are allowed to pass through the filters.

In the case of the transmission filter, the first resonance frequency is set to the reception frequency, the second resonance frequency is set to the frequency of one of the harmonics of the transmission frequency, and the third resonance frequency is set to the transmission frequency.

In the case of the reception filter, the first resonance frequency is set to the frequency of one of the harmonics of the transmission frequency, the second resonance frequency is set to the transmission frequency, and the third resonance frequency is set to the reception frequency.

A combination of the first and second parallel resonance circuits and the coil which is serially connected to the first parallel resonance circuit forms an equivalent circuit providing a small insertion impedance.

DETAILED DESCRIPTION OF THE PREFERRED EMBODIMENT

Figure 1:
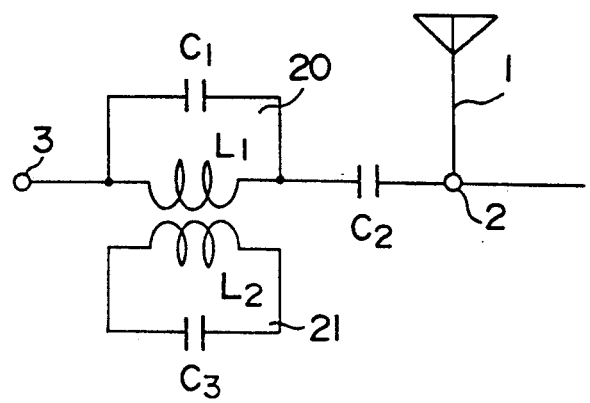
FIG. 1 is a circuit diagram showing a first embodiment of an antenna sharing device according to the present invention.

A first embodiment of an antenna sharing device according to the present invention will be described with reference to FIG. 1 showing a transmission filter of the antenna sharing device.

The transmission filter is constructed of a first parallel resonance circuit 20 and a capacitor $C_2$ connected in series between an antenna branch node 2 to which an antenna 1 is connected and a terminal 3 to which a transmitter (not shown) is connected. A second resonance circuit 21 is also provided which is magnetically coupled to the first resonance circuit 20.

The first resonance circuit 20 is constructed of a coil $L_1$ and a capacitor $C_1$ connected in parallel, and has a resonance frequency two times higher than a transmission frequency. The second resonance circuit 21 is constructed of a coil $L_2$ and a capacitor $C_3$ connected in parallel, and has a resonance frequency same as a reception frequency. The transmission filter is adjusted to have a small insertion impedance at the transmission frequency.

Figure 2:
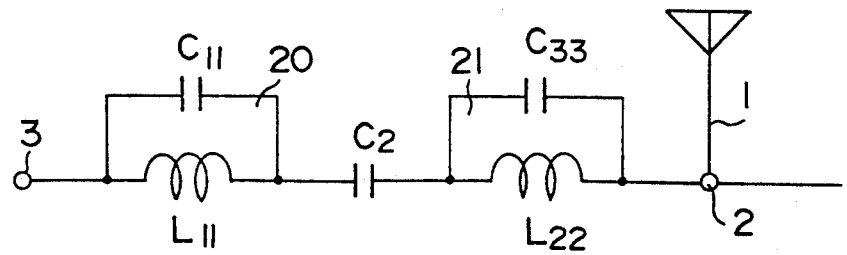
FIG. 2 is an equivalent circuit of the antenna sharing device shown in FIG. 1.

The equivalent circuit of this transmission filter is shown in FIG. 2, this circuit having the first and second parallel resonance circuits 20 and 21 connected in series, with the capacitor $C_2$ being interposed therebetween. It is conceivable that the circuit shown in FIG. 2 is constructed of two resonance circuits, one being a combination of the capacitor $C_2$ and the first resonance circuit 20, and the other being a combination of the capacitor $C_2$ and the second resonance circuit 21. Each resonance circuit combination has two frequencies at which the insertion impedance becomes minimum and maximum. It is therefore possible to adjust the insertion impedance to have a minimum value at the transmission frequency.

In a resonance circuit combination of the capacitor $C_2$ and the second resonance circuit 21, the frequency $f_1$ at which the insertion impedance becomes minimum is given by the following expression (1):

$$f_1 = \tfrac{1}{2}\pi\{L_{22} \cdot (C_2 + C_{33})\}^{\frac{1}{2}} \qquad (1)$$

The frequency $f_2$ at which the insertion impedance becomes maximum is given by the following expression (2):

$$f_2 = \tfrac{1}{2}\pi(L_{22} \cdot C_{33})^{\frac{1}{2}} \qquad (2)$$

In the first resonance circuit 20, the frequency $f_3$ at which the insertion impedance becomes maximum is given by the following expression (3):

$$f_3 = \tfrac{1}{2}\pi(L_{11} \cdot C_{11})^{\frac{1}{2}} \qquad (3)$$

In the expressions (1), (2), and (3), $L_{22}$ and $L_{11}$ represent the inductance values of the coils $L_{22}$ and $L_{11}$, and $C_2$ and $C_{33}$ represent the capacitance values of the capacitors $C_2$ and $C_{33}$.

In this embodiment, the frequency $f_1$ is set to the transmission frequency, the frequency $f_2$ is set to the reception frequency, and the frequency $f_3$ is set to the frequency two times higher than the transmission frequency. The frequency at which the insertion impedance of a resonance circuit combination of the capacitor $C_2$ and the first resonance circuit 20 becomes minimum, although not used in this embodiment, may be set to the transmission frequency.

In the above-described manner, it is possible to provide a small insertion impedance at the transmission frequency, by using a resonance circuit combination of the capacitor $C_2$ and either the parallel resonance circuit 20 or the parallel resonance circuit 21 connected in series in the equivalent circuit. At the reception frequency and the frequency two times higher than the transmission frequency, the insertion impedance of the parallel resonance circuits 21 and 20 is set to have a large value.

Therefore, a transmission signal can be radiated efficiently from the antenna, while preventing a reception signal from entering a transmitter via the terminal 3 and preventing a harmonic two times higher than that of the transmission signal from being radiated from the antenna 1.

If the coupling coefficient between the coils $L_1$ and $L_2$ is made strong or near 1, although attenuation at the reception frequency becomes large, attenuation at the transmission frequency occurs. Therefore, the coupling coefficient is preferably set to the extent that attenuation at the transmission frequency is negligible.

Figure 3:
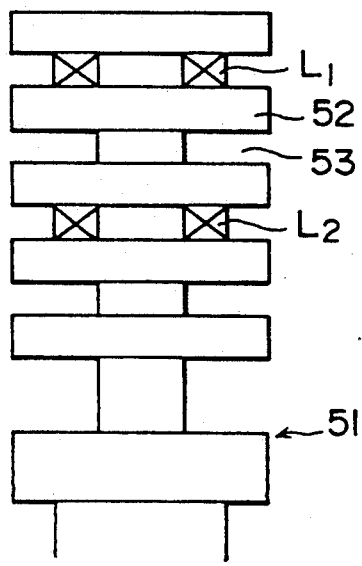
FIG. 3 is a front view of a bobbin on which coils of the antenna sharing device of the first embodiment are wound.

Referring to FIG. 3 showing the front view of a bobbin, the coupling coefficient between the coils $L_1$ and $L_2$ of the resonance circuits 20 and 21 may be adjusted by winding them on the same bobbin 51 and changing the width of a collar 52 or winding trench 53.

Figure 4:
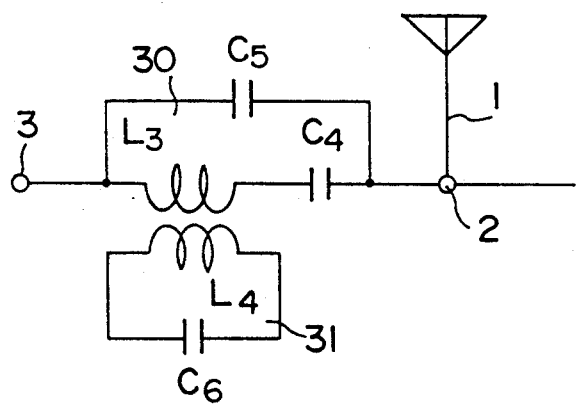
FIG. 4 is a circuit diagram showing a second embodiment of an antenna sharing device according to the present invention.

FIG. 4 is a circuit diagram of a transmission filter of an antenna sharing device of a second embodiment according to the present invention.

The transmission filter is constructed of a first parallel resonance circuit 30 and a second parallel resonance circuit 31 magnetically coupled to the circuit 30. The first parallel resonance circuit 30 has a capacitor $C_5$ connected between an antenna branch node 2 to which an antenna 1 is connected and a terminal 3 to which a transmitter (not shown) is connected. A serial circuit of a coil $L_3$ and a capacitor $C_4$ is connected in parallel with the capacitor $C_5$. The second resonance circuit 31 is constructed of a coil $L_4$ and a capacitor $C_6$ connected in parallel.

The resonance circuit 30 has a resonance frequency two times higher than a transmission frequency to intercept the two times harmonic of the transmission frequency. The resonance circuit 31 has a resonance frequency same as a reception frequency to intercept a reception signal.

Similar to the first embodiment, the transmission filter can be adjusted to have a small insertion impedance at a particular frequency. Therefore, by setting the particular frequency to the transmission frequency, only transmission signals are allowed to pass.

Figure 5:
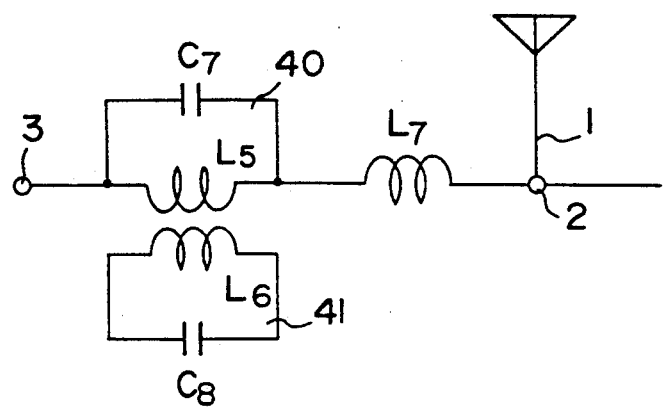
FIG. 5 is a circuit diagram showing a third embodiment of an antenna sharing device according to the present invention.

FIG. 5 is a circuit diagram showing a third embodiment of an antenna sharing device according to the present invention.

The transmission filter is constructed of a first parallel resonance circuit 40 and a coil $L_7$ connected in series between an antenna branch node 2 to which an antenna 1 is connected and a terminal 3 to which a transmitter (not shown) is connected. A second resonance circuit 41 is also provided which is magnetically coupled to the first resonance circuit 40.

The first resonance circuit 40 is constructed of a coil $L_5$ and a capacitor $C_7$ connected in parallel, and has a resonance frequency two times higher than a transmission frequency. The second resonance circuit 41 is constructed of a coil $L_6$ and a capacitor $C_8$ connected in parallel, and has a resonance frequency same as a reception frequency.

Figure 6:
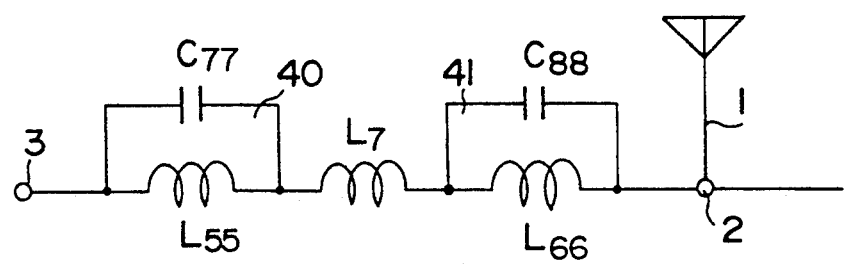
FIG. 6 is an equivalent circuit of the antenna sharing device shown in FIG. 5.

The equivalent circuit of this transmission filter is shown in FIG. 6, this circuit having the first and second parallel resonance circuits 40 and 41 connected in series, with the coil $L_7$ being interposed therebetween. It is conceivable that the circuit shown in FIG. 6 is constructed of two resonance circuits, one being a combination of the coil $L_7$ and the first resonance circuit 40, and the other being a combination of the coil $L_7$ and the second resonance circuit 41. Each resonance circuit combination has two frequencies a which the insertion impedance becomes minimum and maximum. It is therefore possible to adjust the insertion impedance to have a minimum value at the transmission frequency.

In a resonance circuit combination of the coil $L_7$ and the second resonance circuit 41, the frequencies $f_4$ and $f_5$ at which the insertion impedance becomes minimum and maximum are given by the following expressions (4) and (5):

$$f_4 = \tfrac{1}{2}\pi(L_8 \cdot C_{88})^{\frac{1}{2}} \qquad (4)$$

$$f_5 = \tfrac{1}{2}\pi(L_{66} \cdot C_{88})^{\frac{1}{2}} \qquad (5)$$

where $L_8$ is a total serial inductance of the coils $L_7$ and $L_{66}$.

In the resonance circuit combination of the coil $L_7$ and the first resonance circuit 40, the frequency $f_6$ at which the insertion impedance becomes maximum is given by the following expression (6):

$$f_6 = \tfrac{1}{2}\pi(L_{55} \cdot C_{77})^{\frac{1}{2}} \qquad (6)$$

In this embodiment, the frequency $f_4$ is set to the transmission frequency, the frequency $f_5$ is set to the reception frequency, and the frequency $f_6$ is set to the frequency two times higher than the transmission frequency.

Instead of serially connecting a capacitor to the first parallel resonance circuit 40, the coil $L_7$ is connected. Also in this case, the insertion impedance can be made small at the transmission frequency, by a resonance circuit combination of the coil $L_7$ and either the first resonance circuit 40 or the second resonance circuit 41.

The difference between the coil and capacitor connected in series with the first parallel resonance circuit 40 is as follows. With the capacitor connected in series, the frequency at which the insertion impedance becomes small is lower than that at which the insertion impedance becomes large. With the coil connected in series, the frequency at which the insertion impedance becomes small is higher than that at which the insertion impedance becomes large. This is evident from the comparisons between the expressions (1), (2) and (4), (5).

Therefore, a serially connected capacitor is used when the transmission frequency is lower than the reception frequency, and a serially connected coil is used when the transmission frequency is higher than the reception frequency.

Of cordless telephones, a main telephone has the transmission frequency of 46.8 MHz and the reception frequency of 49.8 MHz, and a sub-telephone has the transmission frequency of 49.8 MHz and the reception frequency of 46.8 MHz. Therefore, the transmission filter of an antenna sharing device for a main telephone uses a serially connected capacitor, whereas the transmission filter for a sub-telephone uses a serially connected coil.

In the embodiment abovementioned, the two times harmonic is intercepted by using the parallel resonance circuit which is resonant with the two times frequency of the transmission frequency though, if there are various harmonics involved in the transmission signal such harmonics can be intercepted by resonance circuits which are resonant with such harmonics.

The resonance frequency of the first parallel resonance circuit may be set to the reception frequency, and that of the second parallel resonance circuit may be set to a frequency of one of the harmonics of the transmission frequency.

If the strength of a harmonic is weak, both the resonance frequencies of the first and second parallel resonance circuits may be set to the reception frequency.

A coil or capacitor serially connected to the first parallel resonance circuit may be connected between the transmitter side terminal and the first parallel resonance circuit.

In the above embodiments, a transmission filter has been described. Generally the same circuit configuration is used for a reception filter. The embodiments of a reception filter will be described next.

Figure 7:
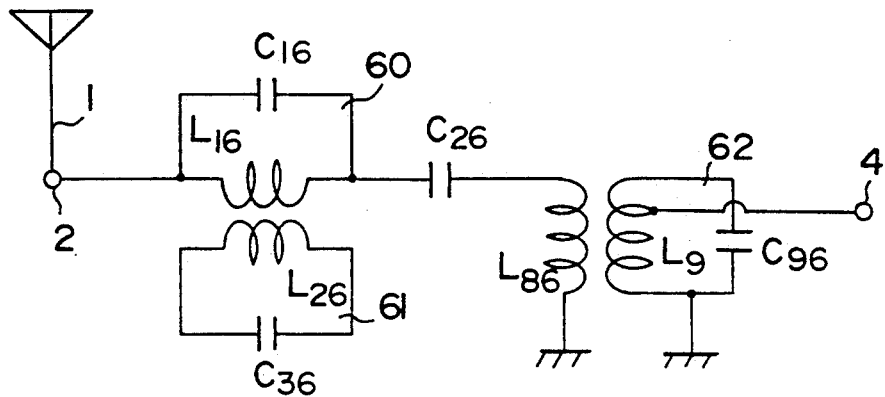
FIG. 7 is a circuit diagram showing a fourth embodiment of an antenna sharing device according to the present invention.

FIG. 7 shows a fourth embodiment of an antenna sharing device according to the present invention. The structure of this embodiment is almost the same as that of the first embodiment.

The reception filter is constructed of a first parallel resonance circuit 60 and a capacitor $C_{26}$ connected in series between an antenna branch node 2 to which an antenna 1 is connected and a reception filter output side. A second resonance circuit 61 is also provided which is magnetically coupled to the first resonance circuit 60.

The first resonance circuit 60 is constructed of a coil $L_{16}$ and a capacitor $C_{16}$ connected in parallel, and has a resonance frequency two times higher than a transmission frequency. The second resonance circuit 61 is constructed of a coil $L_{26}$ and a capacitor $C_{36}$ connected in parallel, and has a resonance frequency same as the transmission frequency. The reception filter constructed as above is adjusted to have a small insertion impedance at the reception frequency.

A parallel resonance circuit 62 of a coil $L_9$ and a capacitor $C_{96}$ is connected between the output side of the reception filter and ground. The resonance circuit 62 is coupled to the capacitor $C_{26}$ via a coupling coil $L_{86}$, and a terminal 4 to which a receiver (not shown) is connected, is connected to a tap of the coil $L_9$. This resonance circuit 62 has a maximum insertion impedance at the reception frequency.

Figure 8:
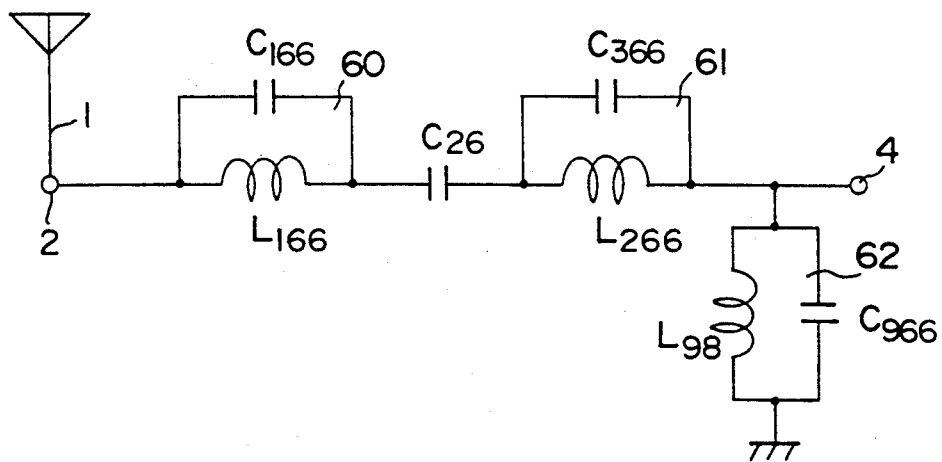
FIG. 8 is an equivalent circuit of the antenna sharing device shown in FIG. 7.

The equivalent circuit of this reception filter is shown in FIG. 8, this circuit having the first and second parallel resonance circuits 60 and 61 connected in series, with the capacitor $C_{26}$ being interposed therebetween. It is conceivable that the circuit shown in FIG. 8 is constructed of two resonance circuits, one being a combination of the capacitor $C_{26}$ and the first resonance circuit 60, and the other being a combination of the capacitor $C_{26}$ and the second resonance circuit 61. Each resonance circuit combination has two frequencies at which the insertion impedance becomes minimum and maximum. It is therefore possible to adjust the insertion impedance to have a minimum value at the reception frequency.

In a resonance circuit combination of the capacitor $C_{26}$ and the second resonance circuit 61, the frequency $f_7$ at which the insertion impedance becomes minimum is given by the following expression (7):

$$f_7 = \tfrac{1}{2}\pi\{L_{26} \cdot (C_{266} + C_{366})\}^{\frac{1}{2}} \qquad (7)$$

The frequency $f_8$ at which the insertion impedance becomes maximum is given by the following expression (8):

$$f_8 = \tfrac{1}{2}\pi(L_{266} \cdot C_{366})^{\frac{1}{2}} \quad (8)$$

In the first resonance circuit 60, the frequency $f_9$ at which the insertion impedance becomes maximum is given by the following expression (9):

$$f_9 = \tfrac{1}{2}\pi(L_{166} \cdot C_{166})^{\frac{1}{2}} \quad (9)$$

In the expressions (7), (8), and (9), $L_{266}$ represent the inductance values of the coils $L_{266}$ and $L_{166}$, and $C_{26}$ and $C_{366}$ represent the capacitance values of the capacitors $C_{26}$ and $C_{366}$.

In this embodiment, the frequency $f_7$ is set to the reception frequency, the frequency $f_8$ is set to the transmission frequency, and the frequency $f_9$ is set to the frequency two times higher than the transmission frequency. The frequency at which the insertion impedance of a resonance circuit combination of the capacitor $C_{26}$ and the first resonance circuit 60 becomes minimum, although not used in this embodiment, may be set to the reception frequency.

In the above-described manner, it is possible to provide a small insertion impedance at the reception frequency, by using a resonance circuit combination of the capacitor $C_{26}$ and either the parallel resonance circuit 60 or the parallel resonance circuit 61 connected in series in the equivalent circuit. At the transmission frequency and the frequency two times higher than the transmission frequency, the insertion impedance of the parallel resonance circuits 61 and 60 is set to have a large value.

Therefore, a reception signal can be received efficiently from the antenna, while preventing a transmission signal from entering a receiver via the terminal 4 and preventing harmonics two times higher than that of the transmission signal from entering the receiver.

If the coupling coefficient between the coils $L_{16}$ and $L_{26}$ is made strong or near 1, although attenuation at the transmission frequency becomes large, attenuation at the reception frequency occurs. Therefore, the coupling coefficient is preferably set to the extent that attenuation at the reception frequency is negligible.

The equivalent circuit of the resonance circuit 62 and the coupling coil $L_{86}$ is shown in FIG. 8 as a parallel circuit of a coil $L_{98}$ and capacitor $C_{966}$.

The resonance circuit 62 is not an essential circuit of the present invention, although it operates to improve the selectivity of the resonance circuit composed of the capacitor $C_{26}$ and the resonance circuit 61 forming a band-pass filter.

Figure 9:
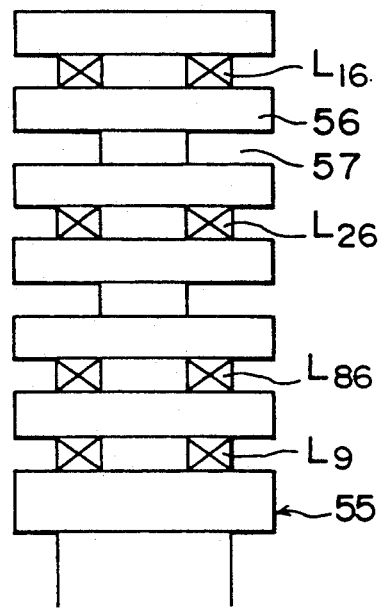
FIG. 9 is a front view of a bobbin on which coils of the antenna sharing device of the fourth embodiment are wound.

Referring to FIG. 9 showing the front view of a bobbin, the coupling coefficient between the coils $L_{16}$ and $L_{26}$ of the resonance circuits 60 and 61 may be adjusted by winding them on the same bobbin 55 and changing the width of a collar 56 or winding trench 57.

Figure 10:
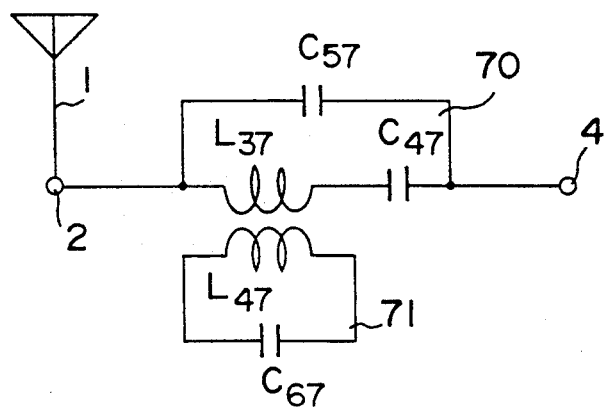
FIG. 10 is a circuit diagram showing a fifth embodiment of an antenna sharing device according to the present invention.

FIG. 10 is a circuit diagram of a reception filter of an antenna sharing device of a fifth embodiment according to the present invention.

The reception filter is constructed of a first parallel resonance circuit 70 and a second parallel resonance circuit 71 magnetically coupled to the circuit 70. The first parallel resonance circuit 70 has a capacitor $C_{57}$ connected between an antenna branch node 2 to which an antenna 1 is connected and a terminal 4 to which a receiver (not shown) is connected. A serial circuit of a coil $L_{37}$ and a capacitor $C_{47}$ is connected in parallel with the capacitor $C_{57}$. The second resonance circuit 71 is constructed of a coil $L_{47}$ and a capacitor $C_{67}$ connected in parallel.

The resonance circuit 70 of the fifth embodiment has a resonance frequency two times higher than a transmission frequency to intercept a harmonic two times higher than the transmission frequency. The resonance circuit 71 has a resonance frequency same as a transmission frequency to intercept a transmission signal.

Similar to the fourth embodiment, the reception filter can be adjusted to have a small insertion impedance at a particular frequency. Therefore, by setting the particular frequency to the reception frequency, only reception signals are allowed to pass.

Figure 11:
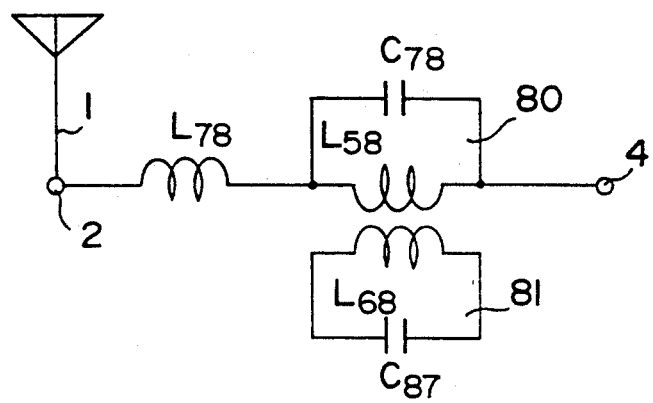
FIG. 11 is a circuit diagram showing a sixth embodiment of an antenna sharing device according to the present invention.

FIG. 11 is a circuit diagram showing a sixth embodiment of an antenna sharing device according to the present invention, this embodiment corresponding to the third embodiment of the transmission filter.

The reception filter is constructed of a first parallel resonance circuit 80 and a coil $L_{78}$ connected in series between an antenna branch node 2 to which an antenna 1 is connected and a terminal 4 to which a receiver (not shown) is connected. A second resonance circuit 81 is also provided which is magnetically coupled to the first resonance circuit 80.

The first resonance circuit 80 is constructed of a coil $L_{58}$ and a capacitor $C_{78}$ connected in parallel, and has a resonance frequency two times higher than a transmission frequency. The second resonance circuit 81 is constructed of a coil $L_{68}$ and a capacitor $C_{87}$ connected in parallel, and has a resonance frequency same as the transmission frequency.

Figure 12:
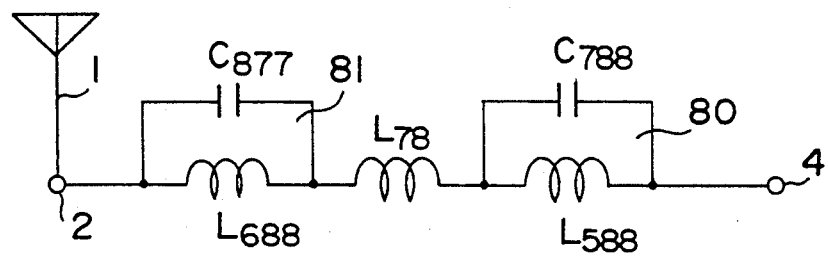
FIG. 12 is an equivalent circuit of the antenna sharing device shown in FIG. 11.
Figure 13:
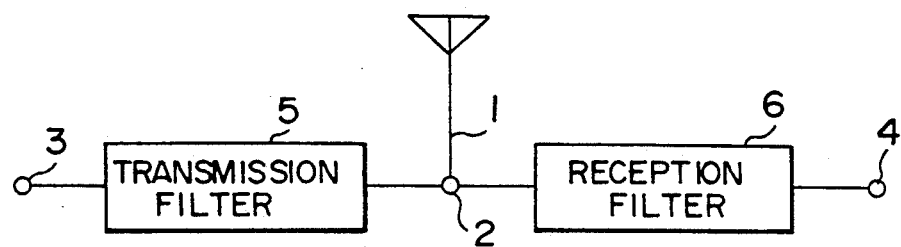
FIG. 13 is a block diagram explaining an antenna sharing device.
Figure 14:
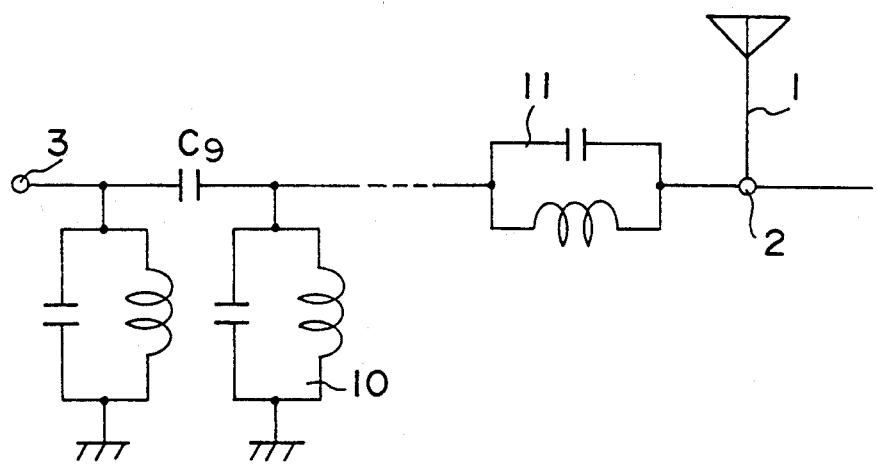
FIG. 14 is a circuit diagram showing part of a transmission filter of a conventional antenna sharing device.

The equivalent circuit of this reception filter is shown in FIG. 12, this circuit having the first and second parallel resonance circuits 80 and 81 connected in series, with the coil $L_{78}$ being interposed therebetween. It is conceivable that the circuit shown in FIG. 12 is constructed of two resonance circuits, one being a combination of the coil $L_{78}$ and the first resonance circuit 80, and the other being a combination of the coil $L_{78}$ and the second resonance circuit 81. Each resonance circuit combination has two frequencies at which the insertion impedance becomes minimum and maximum. It is therefore possible to adjust the insertion impedance to have a minimum value at the reception frequency.

In a resonance circuit combination of the coil $L_{78}$ and the second resonance circuit 81, the frequencies $f_{10}$ and $f_{11}$ at which the insertion impedance becomes minimum and maximum are given by the following expressions (10) and (11):

$$f_{10} = \tfrac{1}{2}\pi(L_{88} \cdot C_{877})^{\frac{1}{2}} \quad (10)$$

$$f_{11} = \tfrac{1}{2}\pi(L_{688} \cdot C_{877})^{\frac{1}{2}} \quad (11)$$

where $L_{88}$ is a total serial inductance of the coils $L_{78}$ and $L_{688}$.

In the resonance circuit combination of the coil $L_{88}$ and the first resonance circuit 80, the frequency $f_{12}$ at which the insertion impedance becomes maximum is given by the following expression (12):

$$f_{12} = \tfrac{1}{2}\pi(L_{588} \cdot C_{788})^{\frac{1}{2}} \quad (12)$$

In this embodiment, the frequency $f_{10}$ is set to the reception frequency, the frequency $f_{11}$ is set to the transmission frequency, and the frequency $f_{12}$ is set to the frequency two times higher than the transmission frequency.

Instead of serially connecting a capacitor to the first parallel resonance circuit 80, the coil $L_{78}$ is connected. Also in this case, the insertion impedance can be made small at the reception frequency, by a resonance circuit combination of the coil $L_{78}$ and either the first resonance circuit 80 or the second resonance circuit 81.

The difference between the coil and capacitor connected in series with the first parallel resonance circuit is as follows. With the capacitor connected in series, the frequency at which the insertion impedance becomes small is lower than that at which the insertion impedance becomes large. With the coil connected in series, the frequency at which the insertion impedance becomes small is higher than that at which the insertion impedance becomes large. This is evident from the comparisons between the expressions (7), (8) and (10), (11).

Therefore, a serially connected capacitor is used when the reception frequency is lower than the transmission frequency, and a serially connected coil is used when the reception frequency is higher than the transmission frequency.

In the fourth to sixth embodiments, the parallel resonance circuit having a resonance frequency two times higher than the transmission frequency is used to intercept the harmonic two times higher than the transmission frequency. If a strong different harmonic is present on a transmission signal, the resonance circuit may be adjusted to have a resonance frequency same as that of such a harmonic to intercept it.

It is obvious that the circuit of the present invention is applied to both the transmission and reception filters.

As described above, at least one of a transmission filter and a reception filter of an antenna sharing device of the present invention is constructed of two magnetically coupled parallel resonance circuits and a capacitor or coil serially connected to one of the two parallel resonance circuits.

A transmission filter of the present invention has an equivalent circuit providing a small insertion impedance at a transmission frequency.

The reception signal and the harmonic of the transmission signal are intercepted by using parallel resonances providing a large insertion impedance, while passing only a transmission signal by using the circuit formed equivalently providing a low insertion impedance.

A reception filter of the present invention has an equivalent circuit providing a small insertion impedance at a reception frequency.

The transmission signal and the harmonic of the transmission signal are intercepted by using parallel resonances providing a large insertion impedance, while passing only a reception signal by using the circuit formed equivalently providing a low insertion impedance.

Since no band-pass filter is used, the number of resonance circuits can be reduced and the circuit structure becomes simple. A small number of coils contributes to realizing a compact antenna sharing device and a low cost.

I claim:

1. An antenna sharing device having a transmission filter connectable between a branch node of an antenna and a transmitter, and a reception filter connectable between the branch node and a receiver, wherein at least one of the transmission filter and said reception filter comprises:
   a first parallel resonance circuit having a capacitor and a coil connected in parallel;
   a second parallel resonance circuit magnetically coupled to said first parallel resonance circuit; and
   a capacitor serially connected to said first parallel resonance circuit,
   wherein one of said first and second parallel resonance circuits has a first resonance frequency, the other of said first and second parallel resonance circuits has one of said first resonance frequency and a second resonance frequency, and a combination of said first and second parallel resonance circuits and said capacitor forms an equivalent circuit providing a small insertion impedance at a third resonance frequency.

2. An antenna sharing device having a transmission filter connectable between a branch node of an antenna and a transmitter, and a reception filter connectable between the branch node and a receiver, wherein at least one of said transmission filter and said reception filter comprises:
   a first parallel resonance circuit having a serial circuit of a capacitor and a coil, and a capacitor connected in parallel with said serial circuit; and
   a second parallel resonance circuit magnetically coupled to said first parallel resonance circuit,
   wherein one of said first and second parallel resonance circuits has a first resonance frequency, the other of said first and second parallel resonance circuits has one of said first resonance frequency and a second resonance frequency, and a combination of said first and second parallel resonance circuits forms an equivalent circuit providing a small insertion impedance at a third resonance frequency.

3. An antenna sharing device having a transmission filter connectable between a branch node of an antenna and a transmitter, and a reception filter connectable between the branch node and a receiver, wherein at least one of said transmission filter and said reception filter comprises:
   a first parallel resonance circuit having a capacitor and a coil connected in parallel;
   a second parallel resonance circuit magnetically coupled to said first parallel resonance circuit; and
   a coil serially connected to said first parallel resonance circuit,
   wherein one of said first and second parallel resonance circuits has a first resonance frequency, the other of said first and second parallel resonance circuits has one of said first resonance frequency and a second resonance frequency, and a combination of said first and second parallel resonance circuits and said coil forms an equivalent circuit providing a small insertion impedance at a third resonance frequency.

4. An antenna sharing device having a transmission filter connectable between a branch node of an antenna and a transmitter, and a reception filter connectable between the branch node and a receiver, wherein said transmission filter comprises:
   a first parallel resonance circuit having a capacitor and a coil connected in parallel;
   a second parallel resonance circuit magnetically coupled to said first parallel resonance circuit; and a capacitor serially connected to said first parallel resonance circuit, said first parallel resonance circuit and said capacitor being serially connected between said branch node and said transmitter, wherein one of said first and second parallel resonance circuits has a first resonance frequency same as a reception frequency, the other of said first and second parallel resonance circuits has one of said first resonance frequency and a second resonance frequency same as the frequency of harmonic components of a transmission frequency, and a combination of said first and second parallel resonance circuits and said capacitor forms an equivalent circuit providing a small insertion impedance at a third resonance frequency same as said transmission frequency.

5. An antenna sharing device having a transmission filter connectable between a branch node of an antenna and a transmitter, and a reception filter connectable between the branch node and a receiver, wherein said transmission filter comprises:

a first parallel resonance circuit having a serial circuit of a capacitor and a coil, and a capacitor connected in parallel with said serial circuit, said first parallel resonance circuit being connected between said branch node and said transmitter; and a second parallel resonance circuit magnetically coupled to said first parallel resonance circuit, wherein one of said first and second parallel resonance circuits has a first resonance frequency same as a reception frequency, the other of said first and second parallel resonance circuits has one of said first resonance frequency and a second resonance frequency same as a frequency of a harmonic component of a transmission frequency, and a combination of said first and second parallel resonance circuits forms an equivalent circuit providing a small insertion impedance at said transmission frequency.

6. An antenna sharing device having a transmission filter connectable between a branch node of an antenna and a transmitter, and a reception filter connectable between the branch node and a receiver, wherein said transmission filter comprises: capacitor and a coil connected in parallel;

a second parallel resonance circuit magnetically coupled to said first parallel resonance circuit; and a coil serially connected to said first parallel resonance circuit, said coil and said first parallel resonance circuit being serially connected between said branch node and said transmitter, wherein one of said first and second parallel resonance circuits has a first resonance frequency same as a reception frequency, the other of said first and second parallel resonance circuits has one of said first resonance frequency and a second resonance frequency same as the frequency of a harmonic component of a transmission frequency, and a combination of said first and second parallel resonance circuits and said coil forms an equivalent circuit providing a small insertion impedance at said transmission frequency.

7. An antenna sharing device according to any one of claims 4 to 6, wherein said coils of said first and second parallel resonance circuits are wound on a same bobbin.

8. An antenna sharing device having a transmission filter connectable between a branch node of an antenna and a transmitter, and a reception filter connectable between the branch node and a receiver, wherein said reception filter comprises:

a first parallel resonance circuit having a capacitor and a coil connected in parallel;

a second parallel resonance circuit magnetically coupled to said first parallel resonance circuit; and a capacitor serially connected to said first parallel resonance circuit, said first parallel resonance circuit and said capacitor being serially connected between said branch node and said receiver, wherein one of said first and second parallel resonance circuits has a first resonance frequency same as a transmission frequency, the other of said first and second parallel resonance circuits has one of said first resonance frequency and a second resonance frequency same as the frequency of harmonic components of said transmission frequency, and a combination of said first and second parallel resonance circuits and said capacitor forms an equivalent circuit providing a small insertion impedance at a reception frequency.

9. An antenna sharing device having a transmission filter connectable between a branch node of an antenna and a transmitter, and a reception filter connectable between the branch node and a receiver, wherein said reception filter comprises:

a first parallel resonance circuit having a serial circuit of a capacitor and a coil, and a capacitor connected in parallel with said serial circuit, said first parallel resonance circuit being connected between said branch node and said receiver; and a second parallel resonance circuit magnetically coupled to said first parallel resonance circuit, wherein one of said first and second parallel resonance circuits has a first resonance frequency same as a transmission frequency, the other of said first and second parallel resonance circuits has one of said first resonance frequency and a second resonance frequency same as a frequency of a harmonic component of said transmission frequency, and a combination of said first and second parallel resonance circuits forms an equivalent circuit providing a small insertion impedance at a reception frequency.

10. An antenna sharing device having a transmission filter connectable between a branch node of an antenna and a transmitter, and a reception filter connectable between the branch node and a receiver, wherein said reception filter comprises:

a first parallel resonance circuit having a capacitor and a coil connected in parallel;

a second parallel resonance circuit magnetically coupled to said first parallel resonance circuit; and a coil serially connected to said first parallel resonance circuit, said coil and said first parallel resonance circuit being serially connected between said branch node and said receiver, wherein one of said first and second parallel resonance circuits has a first resonance frequency same as a transmission frequency, the other of said first and second parallel resonance circuits has one of said first resonance frequency and a second resonance frequency same as the frequency of a harmonic component of said transmission frequency, and a combination of said first and second parallel resonance circuits and said coil forms an equivalent circuit providing a small insertion impedance at a reception frequency.

11. An antenna sharing device according to any one of claims 8 to 10, wherein said coils of said first and second parallel resonance circuits are wound on a same bobbin.

12. An antenna sharing device according to any one of claims 8 to 10, wherein a parallel resonance circuit is provided between the output of said reception filter and ground.

* * * * *